United States Patent
Sawanaka (10) Patent No.: US 10,319,663 B2
(45) Date of Patent: Jun. 11, 2019

(54) SEMICONDUCTOR MEMORY DEVICE

(71) Applicant: TOSHIBA MEMORY CORPORATION, Tokyo (JP)

(72) Inventor: Kenichi Sawanaka, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/910,420

(22) Filed: Mar. 2, 2018

(65) Prior Publication Data
US 2019/0088569 A1 Mar. 21, 2019

(30) Foreign Application Priority Data
Sep. 19, 2017 (JP) .................. 2017-179592

(51) Int. Cl.
| H01L 23/34 | (2006.01) |
|---|---|
| H01L 23/367 | (2006.01) |
| H01L 23/00 | (2006.01) |
| H01L 23/538 | (2006.01) |

(52) U.S. Cl.
CPC ...... H01L 23/3675 (2013.01); H01L 23/5383 (2013.01); H01L 24/16 (2013.01); *H01L 2224/16225* (2013.01); *H01L 2924/1434* (2013.01); *H01L 2924/15321* (2013.01)

(58) Field of Classification Search
CPC ..... H01L 23/36; H01L 23/3675; H01L 23/10; H01L 2023/4037
USPC .................................. 257/707, 713
See application file for complete search history.

(56) References Cited

U.S. PATENT DOCUMENTS

| 5,567,986 A * | 10/1996 | Ishida ................. H01L 23/3672 257/706 |
| 5,869,891 A * | 2/1999 | Rostoker ............. H01L 21/4878 257/706 |
| 7,608,915 B2 * | 10/2009 | Liao .................... H01L 23/4334 257/675 |
| 7,728,440 B2 * | 6/2010 | Honda ................. H01L 21/563 257/704 |
| 8,687,377 B2 | 4/2014 | Harashima et al. |
| 8,921,999 B2 * | 12/2014 | Kimura .............. H01L 23/4334 257/712 |
| 9,349,670 B2 * | 5/2016 | Zhou ................... H01L 23/3738 |
| 2010/0096747 A1* | 4/2010 | Kusano ................ H01L 21/565 257/706 |

(Continued)

FOREIGN PATENT DOCUMENTS

| JP | 3981090 B2 | 9/2007 |
| JP | 5680011 B2 | 3/2015 |
| JP | 2016-189412 A | 11/2016 |

*Primary Examiner* — Nitin Parekh
(74) *Attorney, Agent, or Firm* — Kim & Stewart LLP (57) ABSTRACT

A semiconductor memory device includes a housing having a wall, a circuit board located in the housing and spaced from the wall and extending along the surface of the wall, a memory located on the circuit board, a heat conduction member interposed, and compressed, between the wall and the memory. The wall includes an uneven region comprising contact portions contacting the heat conduction member and recess portions located between the contact portions. The recess portions are recessed inwardly of the wall from the ends of the contact portions in a direction away from the location of the memory.

20 Claims, 11 Drawing Sheets

(56) References Cited

U.S. PATENT DOCUMENTS

| | | | |
|---|---|---|---|
| 2014/0168902 A1* | 6/2014 | Park | H01L 23/367 361/719 |
| 2014/0174706 A1 | 6/2014 | Yamada et al. | |
| 2015/0221625 A1* | 8/2015 | Chun | H01L 24/17 257/707 |
| 2018/0254235 A1* | 9/2018 | Tsuyuno | H01L 25/18 |

* cited by examiner

SEMICONDUCTOR MEMORY DEVICE

CROSS-REFERENCE TO RELATED APPLICATION

This application is based upon and claims the benefit of priority from Japanese Patent Application No. 2017-179592, filed Sep. 19, 2017, the entire contents of which are incorporated herein by reference.

FIELD

Embodiments described herein relate generally to a semiconductor memory device.

BACKGROUND

A semiconductor memory device of the related art has a heat conductive member interposed between a wall of a housing and a semiconductor element.

DETAILED DESCRIPTION

Embodiments provide a semiconductor memory device having a novel configuration with less inconvenience.

In general, according to one embodiment, a semiconductor memory device includes, for example, a housing having a wall, a circuit board located in the housing and spaced from the wall and extending along the surface of the wall, a memory located on the circuit board, a heat conduction member interposed, and compressed, between the wall and the memory. The wall includes an uneven region comprising contact portions contacting the heat conduction member and recess portions located between the contact portions, and the recess portions are recessed inwardly of the wall from the ends of the contact portions in a direction away from the location of the memory. Hereinafter, exemplary embodiments and modified examples will be described. Configurations and technical features of embodiments described below and operation and result achieved by them are given as examples. In addition, the embodiments and the modified examples described below include the similar components. Hereinafter, the similar components will be denoted with the same symbols, and the redundant descriptions will not be repeated.

In each of the drawings, an arrow X indicates a longitudinal direction of a housing 10, an arrow Y indicates a transverse direction (width direction) of the housing 10, and an arrow Z indicates a thickness direction (height direction) of the housing 10. The longitudinal direction, the transverse direction, and the thickness direction of the housing 10 are orthogonal to each other. In following description, the longitudinal direction of the housing 10 is simply referred to as a longitudinal direction, the transverse direction of the housing 10 is simply referred to as a transverse direction, and the thickness direction of the housing 10 is simply referred to as a thickness direction.

Figure 1:
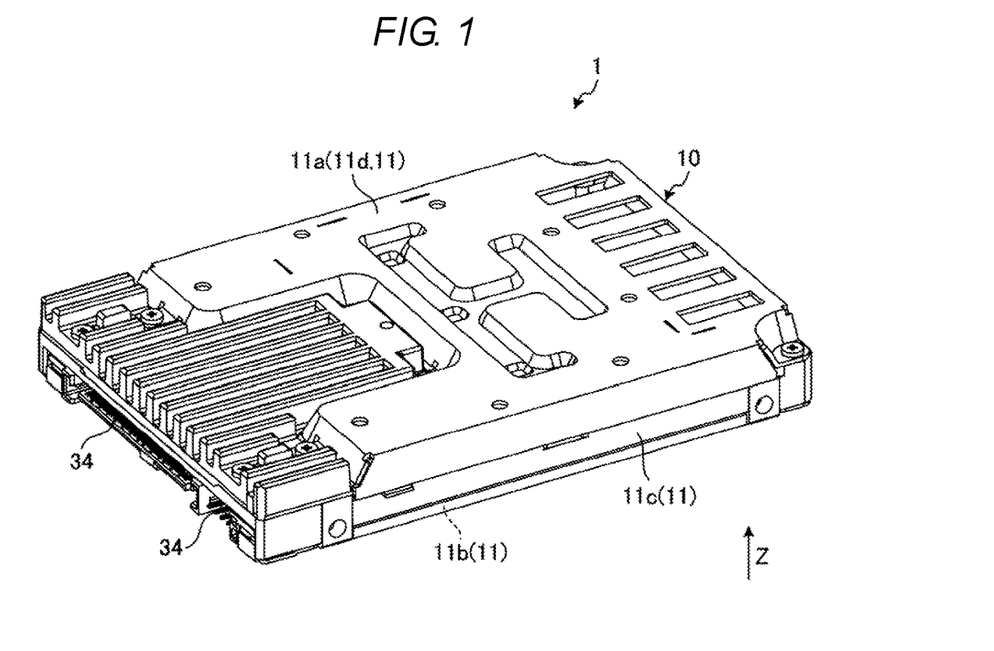
FIG. 1 is a perspective view of a semiconductor memory device according to an embodiment.

FIG. 1 is a perspective view of a semiconductor memory device 1. The semiconductor memory device 1 is, for example, an SSD (solid state drive). The semiconductor memory device 1 may be used by being mounted in an electronic device, or may be used by being connected to the electronic device with a cable or the like.

As illustrated in FIG. 1, the semiconductor memory device 1 includes a housing 10. The housing 10 has a plurality of walls 11. The walls 11 include, for example, outer walls such as a top wall 11a, a bottom wall 11b, and side walls 11c which are exposed outside the housing 10, and an inner wall (not illustrated) such as a partition wall which is accommodated in the housing 10. Components are accommodated in a space surrounded by the outer walls (the walls 11).

The housing 10 is formed by a combination of a plurality of members (components), for example. Specifically, for example, the plurality of members are coupled to each other by fasteners such as screws, thereby forming the housing 10. The housing 10 (the wall 11 thereof) is formed of a metal material such as an aluminum alloy having a relatively high heat dissipation property. An interface 34 is exposed through an opening provided in the housing 10. The interface 34 may also be referred to as a connector or a connection unit, for example.

Figure 2:
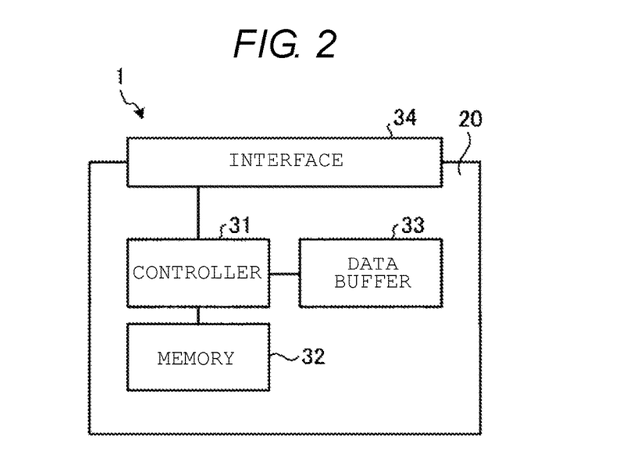
FIG. 2 is a block diagram of a substrate assembly provided in the semiconductor memory device according to the embodiment.

FIG. 2 is a block diagram of a substrate assembly accommodated in the housing 10 of the semiconductor memory device 1. The semiconductor memory device 1 has a circuit board 20. The substrate assembly is configured in which the circuit board 20 is mounted with electrical components, for example, a controller 31, a memory 32, a data buffer 33, and the interface 34. The circuit board 20 may also be mounted with a power circuit (not illustrated) or other circuits. In FIG. 2, the controller 31, the memory 32, the data buffer 33, and the interface 34 are each depicted once, but the number of each component may be two or more.

The controller 31 controls the semiconductor memory device 1. The function of the controller 31 is achieved by, for example, a processor which executes firmware stored in the memory 32 or a read only memory (ROM) of the controller 31, or hardware. The controller 31 reads out data from the memory 32 or writes data in the memory 32 according to a command from a host device. The controller 31 may also be referred to as a control unit or an arithmetic processing unit.

The memory 32 is a nonvolatile memory, and for example a NAND-type flash memory. The memory 32 may be a resistance random access memory (RERAM), a ferroelectric random access memory (FERAM), or a flash memory having a three-dimensional structure in addition to the NAND-type flash memory. Further, the memory 32 stores user data transmitted from the outside (from a host device, a server device, etc.) of the semiconductor memory device 1, or only stores system data used in the semiconductor memory device 1. The memory 32 includes a memory cell array in which a plurality of memory cells (not illustrated) are arranged in a matrix configuration. Each of the memory cells can store binary value or multi-value data. In addition, the memory 32 includes a plurality of memory chips. The memory 32 may also be referred to as a storage unit.

The data buffer 33 temporarily stores data. The data buffer 33 is a dynamic random access memory (DRAM), for example. Further, the data buffer 33 may be a static random access memory (SRAM) in addition to the DRAM. The data buffer 33 may be independently provided from the controller 31, or may be formed in the chip of the controller 31, as a built-in memory.

The interface 34 has a plurality of pins (terminals) through which electrical signals or power is transmitted with respect to an external device. The pins of the interface 34 also include ground pins. The interface 34 is configured in conformity to serial ATA (SATA), serial attached SCSI (SAS), or PCI express (PCIe®) protocols, for example.

The circuit board 20 is, for example, a multilayer board or a build-up board. The circuit board 20 may also be referred to as a printed wiring board. The circuit board 20 is a rigid board. Further, the circuit board 20 has a flat plate shape, for example.

First Embodiment

Figure 3:
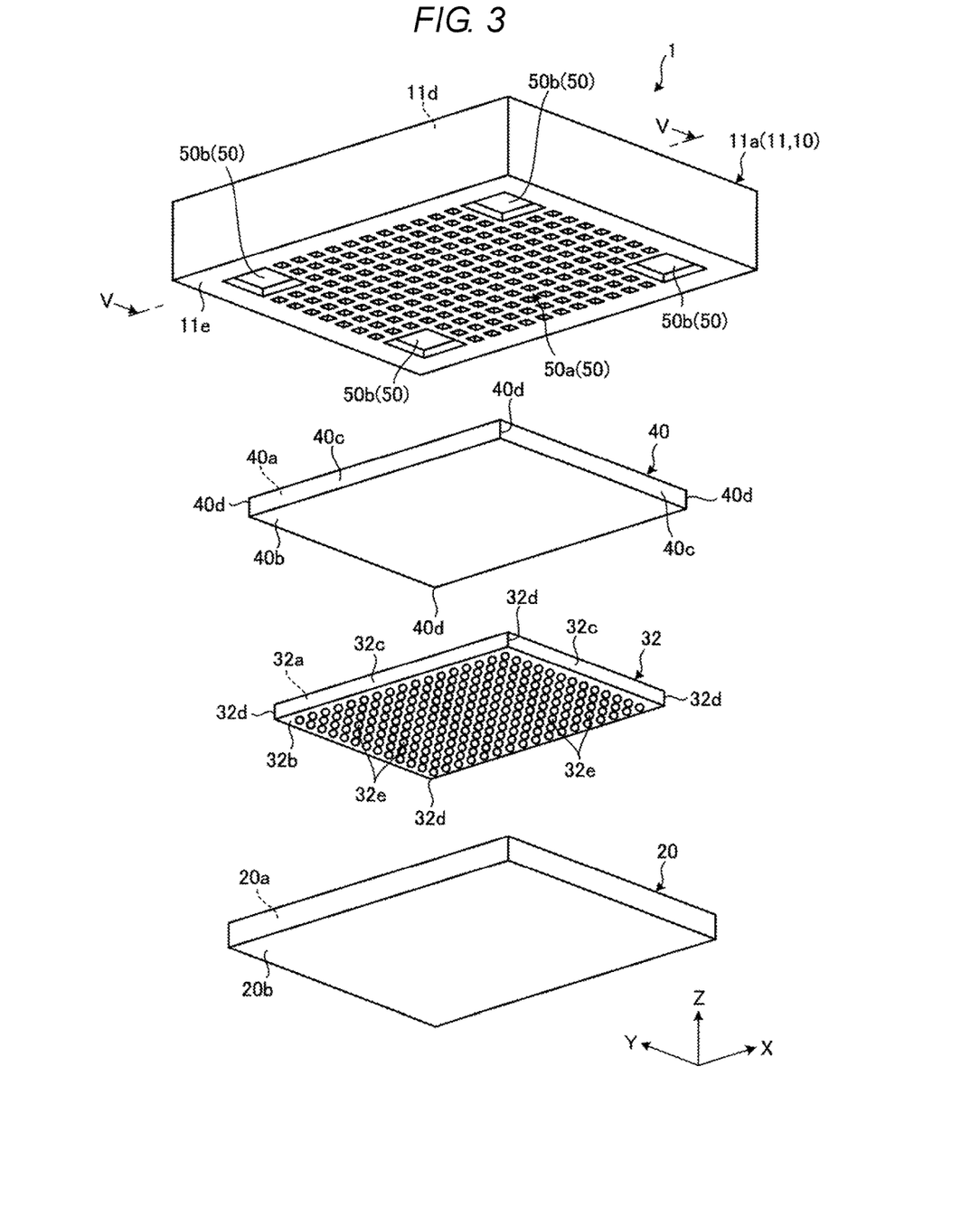
FIG. 3 is an exploded perspective view of a part of a semiconductor memory device according to a first embodiment.
Figure 4:
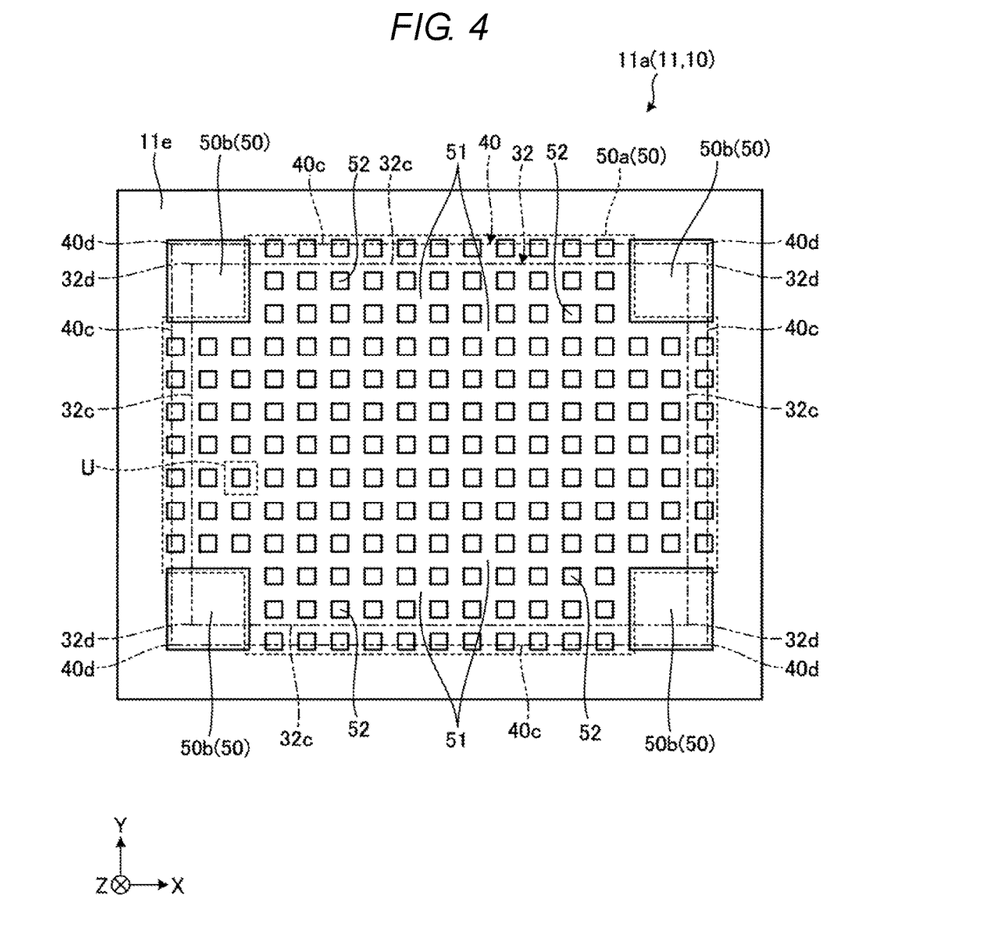
FIG. 4 is a plan view of a part of an inner surface of a wall of a housing provided in the semiconductor memory device according to the first embodiment.
Figure 5:
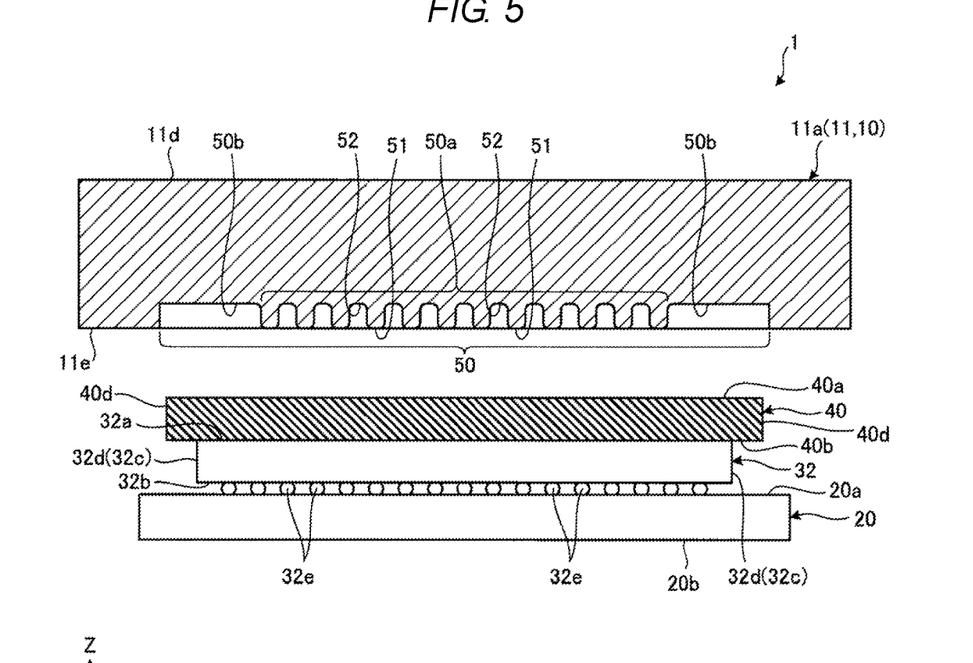
FIG. 5 is an exploded cross-sectional view taken along line V-V in FIG. 3 of a part of the semiconductor memory device according to the first embodiment before assembly.
Figure 6:
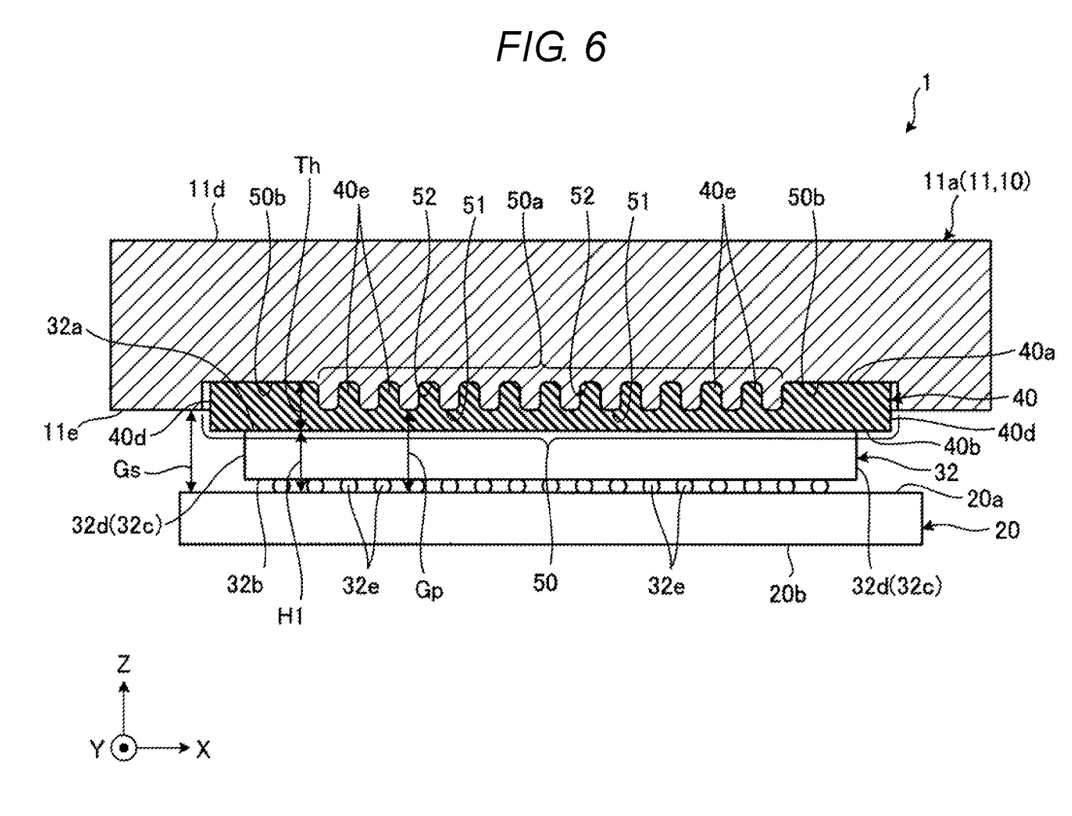
FIG. 6 is a cross-sectional view taken along the line V-V in FIG. 3 of a part of the semiconductor memory device according to the first embodiment.

FIG. 3 is an exploded perspective view of a part of the semiconductor memory device 1 according to the first embodiment, FIG. 4 is a plan view of a part of an inner surface 11e of the wall 11 of the housing 10 provided in the semiconductor memory device 1, FIG. 5 is an exploded cross-sectional view of a part of the semiconductor memory device 1 before assembly, and FIG. 6 is a cross-sectional view of a part of the semiconductor memory device 1 after assembly.

As illustrated in FIG. 3, the circuit board 20, the memory 32, a heat conduction member 40, and the wall 11 are stacked in this order in a thickness direction on the semiconductor memory device 1. The thickness direction of the semiconductor memory device 1 is also a thickness direction of the circuit board 20, the memory 32, the heat conduction member 40, and the wall 11. The first embodiment has a configuration in which the memory 32 and the heat conduction member 40 are interposed between the top wall 11a and the circuit board 20, but the semiconductor memory device 1 may also have the similar configuration between the bottom wall 11b, the side walls 11c, or an inner wall (not illustrated) other than the top wall 11a and the circuit board 20.

The circuit board 20 extends in a longitudinal direction and a transverse direction and has a thin flat shape in the thickness direction. The circuit board 20 includes a top surface 20a close to the top wall 11a and a bottom surface 20b opposite to the top surface 20a. The top surface 20a and the bottom surface 20b are parallel to each other, extend in the longitudinal direction and the transverse direction, and are orthogonal to (intersect with) the thickness direction. Further, the top surface 20a faces the inner surface 11e of the top wall 11a with a clearance therebetween. The top surface 20a and the bottom surface 20b are examples of surfaces (outer surfaces) of the circuit board 20.

The memory 32 is a memory package (electronic component). The memory 32 includes a surface-mounted ball grid array (BGA) as an example in the first embodiment, but may be another type of memory package. The memory 32 extends in the longitudinal direction and the transverse direction and has a thin flat shape in the thickness direction. The memory 32 includes a top surface 32a close to the top wall 11a, a bottom surface 32b opposite to the top surface 32a, and side surfaces 32c. The top surface 32a and the bottom surface 32b are parallel to each other, extend in the longitudinal direction and the transverse direction, and are orthogonal to (intersect with) the thickness direction. The side surfaces 32c are provided across between the top surface 32a and the bottom surface 32b and intersects with at least one of the longitudinal direction and the transverse direction. The top surface 32a, the bottom surface 32b, and the side surfaces 32c are examples of surfaces (outer surfaces) of the memory 32.

Further, the memory 32 is formed in a rectangular shape in a sight line of the thickness direction (arrow Z), and has four corners 32d in the sight line. The corner 32d is located between two side surfaces 32c adjacent to each other. In addition, the side surfaces 32c of the memory 32 are four side portions in the sight line of the thickness direction. That is, the side surfaces 32c are examples of the side portions of the memory 32.

Electrodes (not illustrated) provided on the bottom surface 32b of the memory 32 are electrically and mechanically connected to electrodes (not illustrated) provided on the top surface 20a of the circuit board 20 by solder balls 32e. The plurality of solder balls 32e are entirely or locally arranged in a lattice shaped pattern, for example. The solder balls 32e may also be referred to as a joint unit or a connection unit.

The heat conduction member 40 extends in the longitudinal direction and the transverse direction and has a thin flat shape in the thickness direction, and is provided to conduct or transfer heat generated by the memory package to the wall, to allow it to be dissipated from the wall of the housing 10. The heat conduction member 40 includes a top surface 40a close to the top wall 11a, a bottom surface 40b opposite to the top surface 40a, and side surfaces 40c. In a state before assembly, the top surface 40a and the bottom surface 40b are parallel to each other, extend in the longitudinal direction and the transverse direction, and are orthogonal to (intersect with) the thickness direction. The side surfaces 40c are provided across between the top surface 40a and the bottom surface 40b and intersect with at least one of the longitudinal direction and the transverse direction. The top surface 40a, the bottom surface 40b, and the side surfaces 40c are examples of surfaces (outer surfaces) of the heat conduction member 40. Further, the heat conduction member 40 is formed in a rectangular shape in the sight line of the thickness direction (arrow Z), but may be formed in any shape.

In addition, the heat conduction member 40 has the rectangular shape in the sight line of the thickness direction (arrow Z), and has four corners 40d in the sight line. The corners 40d are located between two side surfaces 40c adjacent to each other. Further, the side surfaces 40c of the heat conduction member 40 are four side portions in the sight line of the thickness direction. That is, the side surfaces 40c are examples of the side portions of the heat conduction member 40.

The heat conduction member 40 has elasticity and can be elastically compressed and deformed by being sandwiched between the top wall 11a and the memory 32. Further, the heat conduction member 40 is made of an elastomer such as silicone rubber having relatively high heat conductivity. The heat conduction member 40 is formed in a sheet shape. The heat conduction member 40 may also be referred to as a heat dissipation member, a heat conductive sheet, or a heat dissipation sheet.

The top wall 11a includes an outer surface 11d exposed outside the housing 10 and an inner surface 11e opposite to the outer surface 11d. The outer surface 11d and the inner surface 11e are examples of surfaces of the top wall 11a (the wall 11).

An uneven region 50 is provided in an area where the inner surface 11e of the top wall 11a is in contact with the heat conduction member 40.

In the first embodiment as illustrated in FIGS. 4 and 5, the uneven region 50 includes a contact portion 51 (contact surface) and a recess portion 52. The contact portion 51 is in contact with the heat conduction member 40. The recess portion 52 is recessed from the contact portion 51 (inner surface 11e) in a direction away from the memory 32. The contact portion 51 may also be referred to as a projection portion, a protrusion portion, a protrusion end, an end face, or a pressing portion, for example.

At least one contact portion 51 and at least one recess portion 52 are included in a distributed arrangement region 50a. The distributed arrangement region 50a may include a plurality of contact portions 51, a plurality of recess portions 52, or a plurality of contact portions 51 and recess portions 52. In the distributed arrangement region 50a, at least one portion of the contact portions 51 and at least one portion of the recess portions 52 are dispersedly (discretely) arranged with respect to other portions. The distributed arrangement region 50a may also be referred to as a discrete arrangement region.

The distributed arrangement region 50a can have a repetitive pattern of at least one of the contact portion 51 and the recess portion 52. The repetitive pattern is a shape in which a unit shape U is repeatedly provided at a predetermined frequency or pitch (repeating unit of length) in a predetermined direction along the inner surface 11e. In the first embodiment as illustrated in FIG. 4, as an example, the plurality of recess portions 52 having the rectangular shape in the sight line of the thickness direction are discretely arranged in a lattice shaped pattern or two-dimensional matrix pattern. That is, the distributed arrangement region 50a has a repetitive pattern in which the unit shape U including the recess portion 52 and the rectangular frame-like contact portion 51 surrounding the recess portion 52 with a certain width is repeatedly arranged in a lattice shaped pattern at predetermined frequency per unit of length in the longitudinal direction and the transverse direction. In the first embodiment, the frequency of the unit shape U in the longitudinal direction and the transverse direction is the same, but they may be a different frequency. Further, the recess portion 52 has a square shape in the sight line of the thickness direction (in plan view with respect to the top surface 20a of the circuit board 20), but may have a rectangular shape, a circular shape, other polygonal shapes, or other shapes. The unit shape U may have any shape in plan view of the inner surface 11e. In addition, the shape of cross section intersecting with the thickness direction of the recess portion may be changed along the thickness direction. The distributed arrangement region 50a may also be referred to as a repetitive arrangement region.

Further, the distributed arrangement region 50a may include contact portions 51 arranged in a mesh shaped pattern or recess portions 52 arranged in a mesh shaped pattern. In the first embodiment as illustrated in FIG. 4, as an example, the contact portions 51 are arranged in a mesh shaped pattern and the recess portions 52 are surrounded by the contact portions 51 arranged in the mesh shaped pattern.

In the first embodiment as illustrated in FIGS. 4 and 5, the uneven region 50 includes recess portions 50b independently located from the distributed arrangement region 50a. The recess portion 50b is recessed from the contact portion 51 (the inner surface 11e) in a direction away from the memory 32. The recess portion 50b has a rectangular shape including sides along the longitudinal direction and sides along the transverse direction. An opening end in the recess portion 50b, i.e., the size of the opening in the X-Y direction, has an opening area larger in the X-Y direction than that of the opening end of the recess portion 52 in the distributed arrangement region 50a. In addition, the recess portion 50b is provided at a position overlying the corner 32d of the memory 32 in the thickness direction on the inner surface 11e, in other words, at a position opposite to the corner 32d with respect to the heat conduction member 40. Further, the recess portion 50b is provided such that the corner 32d of the memory 32 is located within the recess portion 50b in the sight line of the thickness direction.

In an assembled state as illustrated in FIG. 6, the heat conduction member 40 is elastically compressed between the top wall 11a and the memory 32, and the top surface 40a of the heat conduction member 40 is partially pushed into the recess portions 52 and 50b while being elastically deformed. In other words, the heat conduction member 40 is partially inserted (penetrated) into the recess portions 52 and 50b. In other words, the contact portion 51 (projection portion) partially enters into the heat conduction member 40 from the top surface 40a of the heat conduction member 40 contacting the surfaces of the recess portions 50b and 52. A portion 40e of the heat conduction member 40 inserted into the recess portions 52 and 50b may be referred to as an insertion portion, a pushing portion, or a protrusion portion, for example. As illustrated in FIGS. 5 and 6, an edge of the protrusion end of the contact portion 51 is rounded. The uneven region 50 can be formed by, for example, die casting of an aluminum alloy.

In FIG. 6, H1 represents a height of the memory 32 from the top surface 20a of the circuit board 20 in the assembly state, Th represents a maximum thickness of the heat conduction member 40 in the assembled state, i.e., the uncompressed thickness thereof, and Gp represents a size (height) of the clearance between the top surface 20a and the tip of the contact portion 51 in the assembly state. In this case, if a condition of H1+Th≥Gp is satisfied, the heat conduction member 40 is compressed at least between the contact portion 51 and the top surface 32a of the memory 32 and can be brought into contact with both the contact portion 51 and the top surface 32a.

Second Embodiment

Figure 7:
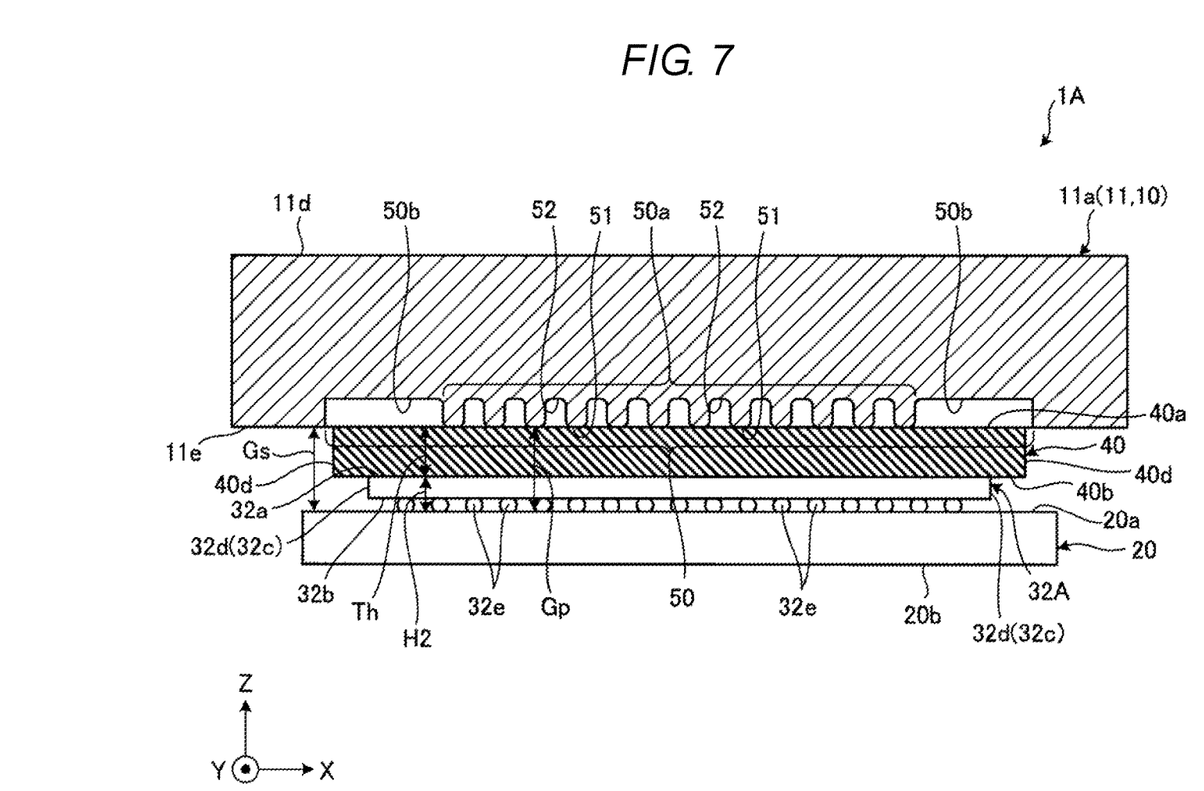
FIG. 7 is an exploded cross-sectional view taken along a position equal to the line V-V in FIG. 3 of a part of a semiconductor memory device according to a second embodiment having the same components as those of the semiconductor memory device according to the first embodiment before assembly.

FIG. 7 is a partial cross-sectional view of a semiconductor memory device 1A according to a second embodiment at the same position as in FIG. 6, the semiconductor memory device 1A including the same components as those of the first embodiment except for the memory 32A, for example. A height H2 of a memory 32A according to the second embodiment is less than the height H1 of the memory 32 in the first embodiment. It should be noted that in the second embodiment, the semiconductor memory device 1A includes a circuit board 20 having the same thickness as that in the first embodiment, and the heat conduction member 40 contacts both the memory 32 and the contact portion 51. Also in the second embodiment, if a condition of H2+Th≥Gp is satisfied, the heat conduction member 40 is compressed at least between the contact portion 51 and a top surface 32a of the memory 32, and can be brought into close contact with both the contact portion 51 and the top surface 32a of the memory 32. That is, even when the housing 10 and the heat conduction member 40 are shared with the memory 32 (32A) having a height H satisfying a condition of Gp−H<Th (where, H: the height of the memory 32 (32A) from the top surface 20a of the circuit board 20), it is possible to secure a state where the heat conduction member 40 can be brought into close contact with both the contact portion 51 and the top surface 32a of the memory 32.

In this way, when the housing 10 (top wall 11a or wall 11) and the heat conduction member 40 are used with different memory having different specifications of the height thereof, if the inner surface 11e of the top wall 11a is not provided with the recess portions 52 and 50b, a compression ratio of the heat conduction member 40 tends to be high in the specification of the memory 32 having a large memory capacity and a high height, and a compression repulsion force also tends to increase due to the elasticity of the heat conduction member 40. As the compression repulsion force increases, a force (pressure) acting on the solder ball 32e increases and reliability and durability of the solder ball 32e are deteriorated. Therefore, according to the related art, it is difficult to share the housing 10 and the heat conduction member 40 having fixed dimensions with different memory 32, which differ greatly in height, from the viewpoint of securing the reliability and the durability of the solder ball 32e.

In this regard, the semiconductor memory device 1 and 1A of the above-described embodiments have the configuration in which the uneven region 50 including the contact portions 51 and the recess portions 52 and 50b is provided on the inner surface 11e of the top wall 11a. In such a configuration, since the heat conduction member 40 is deformed and pushed (inserted and entered) into the recess portions 52 and 50b when the memory 32 is thicker in the height direction, the compression ratio of the heat conduction member 40 can be further reduced and the repulsion force due to the compression of the heat conduction member 40 can also be further reduced as compared with a configuration in which the recess portions 52 and 50b are not provided, for example. Accordingly, for example, the reliability and the durability of the solder ball 32e (connection unit or joint unit) are more easily improved between the memory 32 (32A) and the circuit board 20. Therefore, as described above, the housing 10 and the heat conduction member 40 are easily shared with the semiconductor memory devices 1 and 1A respectively having memory 32 and 32A with different heights.

In the embodiments described above, the uneven region 50 includes the distributed arrangement region 50a in which the plurality of recess portions 52 are dispersedly arranged. Therefore, for example, as compared with the case where the recess portions 52 are locally provided, it is possible to reduce variations in the repulsion force of the heat conduction member 40 acting on the plurality of solder balls 32e, so that the solder balls 32e and the semiconductor memory devices 1 and 1A are easily improved in reliability and durability.

In the embodiments described above, the distributed arrangement region 50a is a region in which the contact portions 51 are provided in the mesh shaped pattern. Further, the distributed arrangement region 50a is a region in which the plurality of repetitive patterns having the unit shape U including the recess portions 52 and the contact portions 51 are provided. Accordingly, for example, it is possible to achieve the configuration, in which the reliability and the durability of the solder balls 32e are more easily improved, with a relatively simple configuration.

In the embodiments described above, the uneven region 50 includes the recess portions 50b located on the side opposite to the corners 32d of the memory 32 (memory package) with respect to the heat conduction member 40. A larger force is more likely to act on the solder balls 32e provided in the corners 32d of the memory 32 due to deflection of the housing 10 and the circuit board 20, compared to the solder balls provided in other portions. For this reason, the embodiments described above have the configuration in which the recess portions 50b are provided on the side opposite to regions of the corner 32d of the memory 32. Accordingly, for example, the force acting on the solder balls 32e provided in the corners 32d of the memory 32 by the compression repulsion force due to the heat conduction member 40 can be made smaller, so that the solder balls 32e and the semiconductor memory devices 1 and 1A are more easily improved in reliability and durability. In addition, the recess portions 50b are provided such that the corners 32d of the memory 32 overlie the recess portions 50b in the sight line of the thickness direction. Therefore, it is possible to further reduce the force acting on the solder balls 32e provided in the corners 32d of the memory 32.

Third Embodiment

Figure 8:
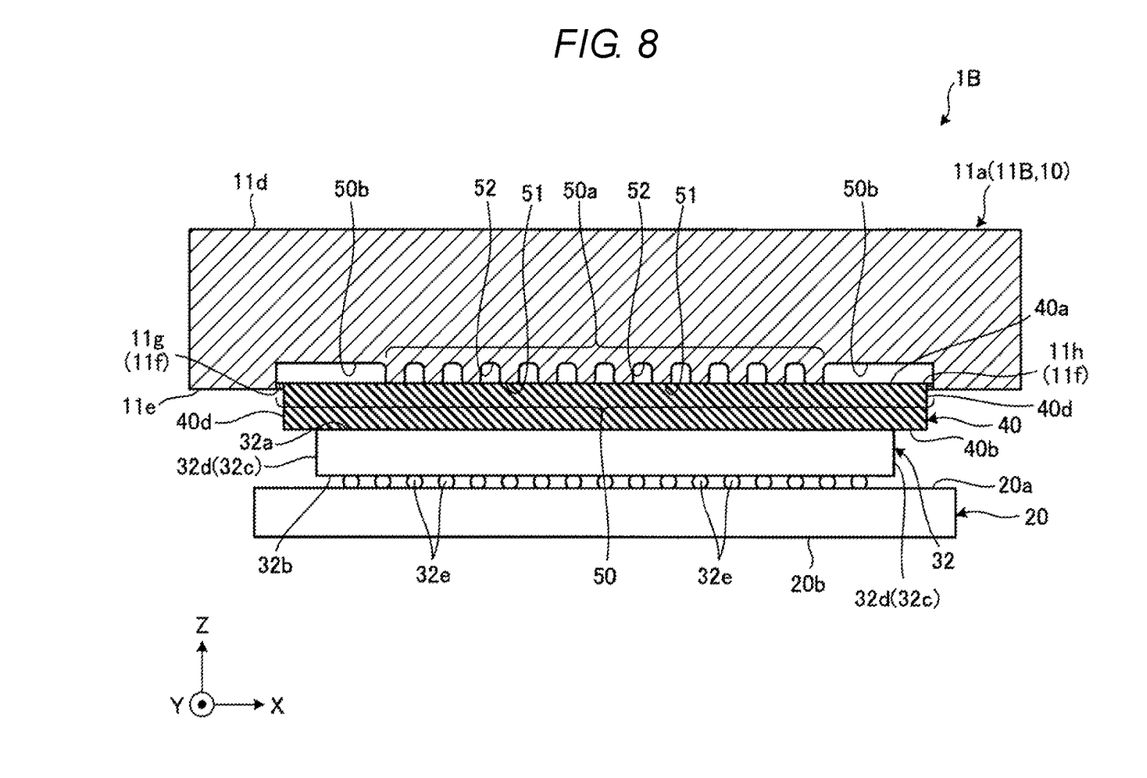
FIG. 8 is a cross-sectional view taken along a position equal to the line V-V in FIG. 3 of a part of a semiconductor memory device according to a third embodiment before assembly.
Figure 9:
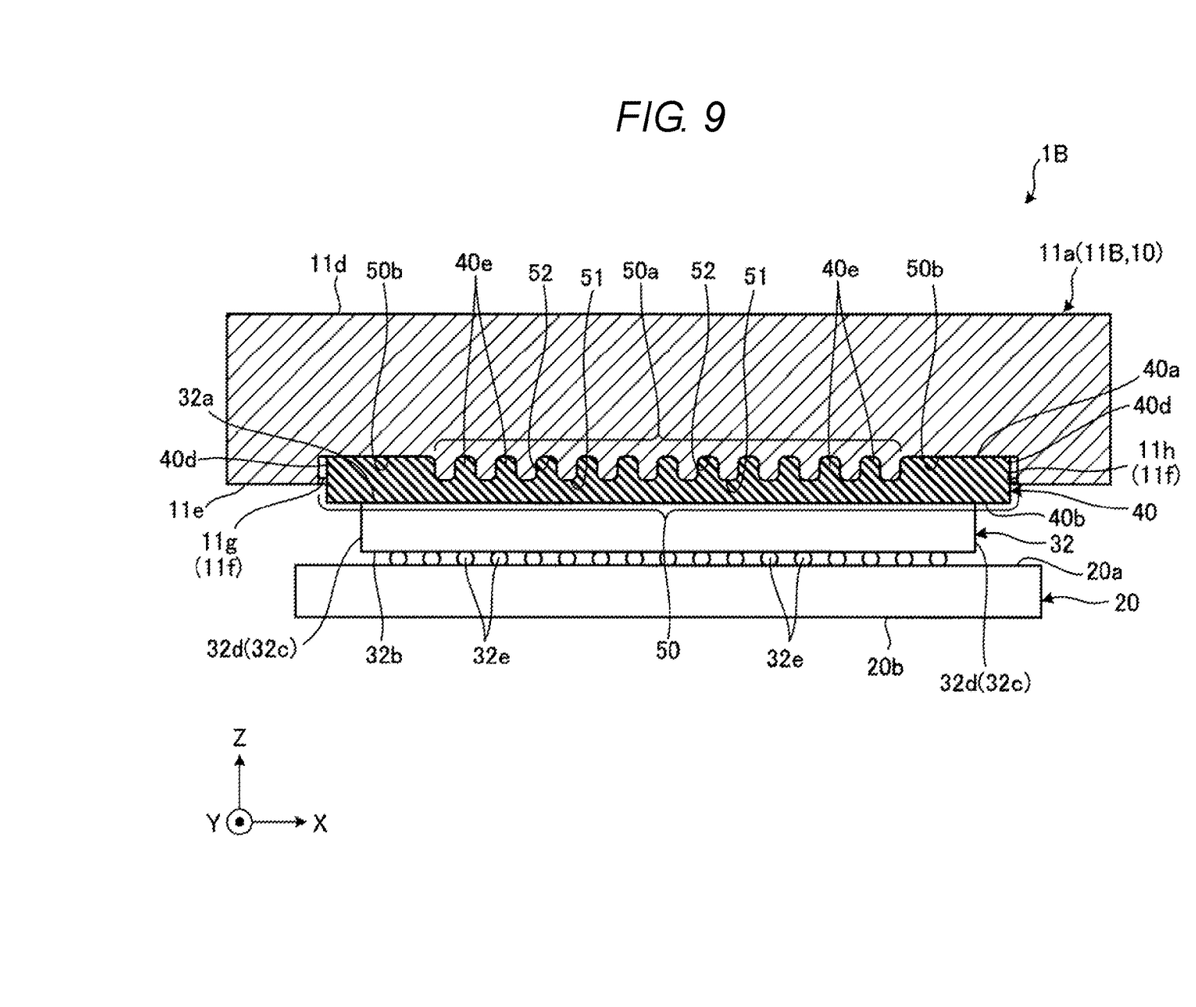
FIG. 9 is a cross-sectional view taken along a position equal to the line V-V in FIG. 3 of a part of the semiconductor memory device according to the third embodiment.

FIG. 8 is a partial cross-sectional view of a semiconductor memory device 1B according to a third embodiment before assembly, and FIG. 9 is a partial cross-sectional view of the semiconductor memory device 1B after assembly. A top wall 11a of the semiconductor memory device 1B is provided with a recess portion 11f which is recessed from an inner surface 11e in a direction away from a memory 32, extends circumferentially around the uneven region 50, and is capable of partially accommodating a heat conduction member 40 therein. The inner surface 11e is an example of a first surface, and the recess portion 11f is an example of a first recess portion. Contact portions 51 and recess portions 52 and 50b are provided on a bottom surface 11g of the recess portion 11f. Therefore, it is possible to assemble the circuit board 20 provided with the top wall 11a (wall 11B) and the memory 32 in a state where the heat conduction member 40 is attached to the bottom surface 11g of the recess portion 11f. In addition, when the heat conduction member 40 is attached to the bottom surface 11g of the recess portion 11f, aside surface 11h of the recess portion 11f can function as a positioning portion (guide) of the heat conduction member 40 in a direction along an inner surface 11e, that is, an intersection direction (a longitudinal direction and a transverse direction) with a thickness direction. Therefore, according to such a configuration, for example, the heat conduction member 40 can be more easily or more accurately assembled.

First Modified Example

Figure 10:
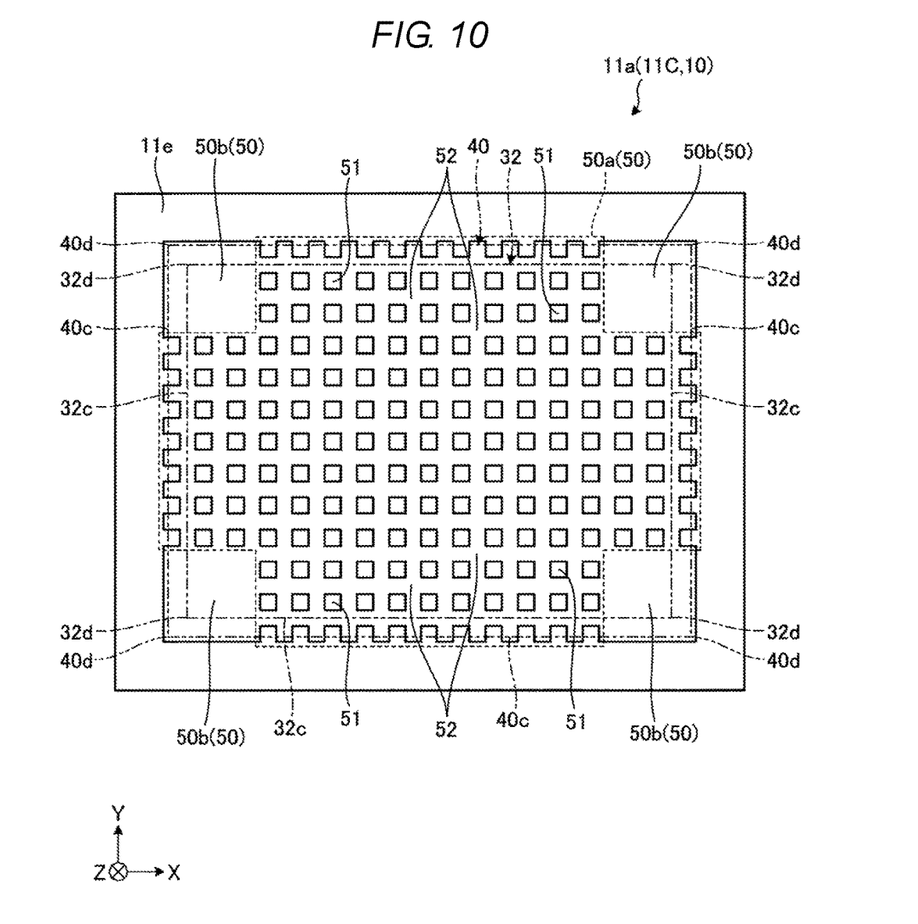
FIG. 10 is a plan view of a part of an inner surface of a wall of a housing provided in a semiconductor memory device according to a first modified example.

FIG. 10 is a partial plan view of an inner surface 11e of a top wall 11a (wall 11C) of a housing 10 according to a first modified example. The top wall 11a according to the first modified example can be replaced with the top wall 11a of the semiconductor memory devices 1, 1A, and 1B according to the embodiments described above. In the first modified example, recess portions 52 are arranged in a mesh shaped pattern, and a plurality of contact portions 51 are dispersed and arranged in a lattice shaped pattern. Here, the recess portions 52 and contact portions 51 extend to the sides of the inner surface 11e of the top wall 11a. Even with such a configuration, it is possible to obtain the same effect as in the embodiments described above.

Second Modified Example

Figure 11:
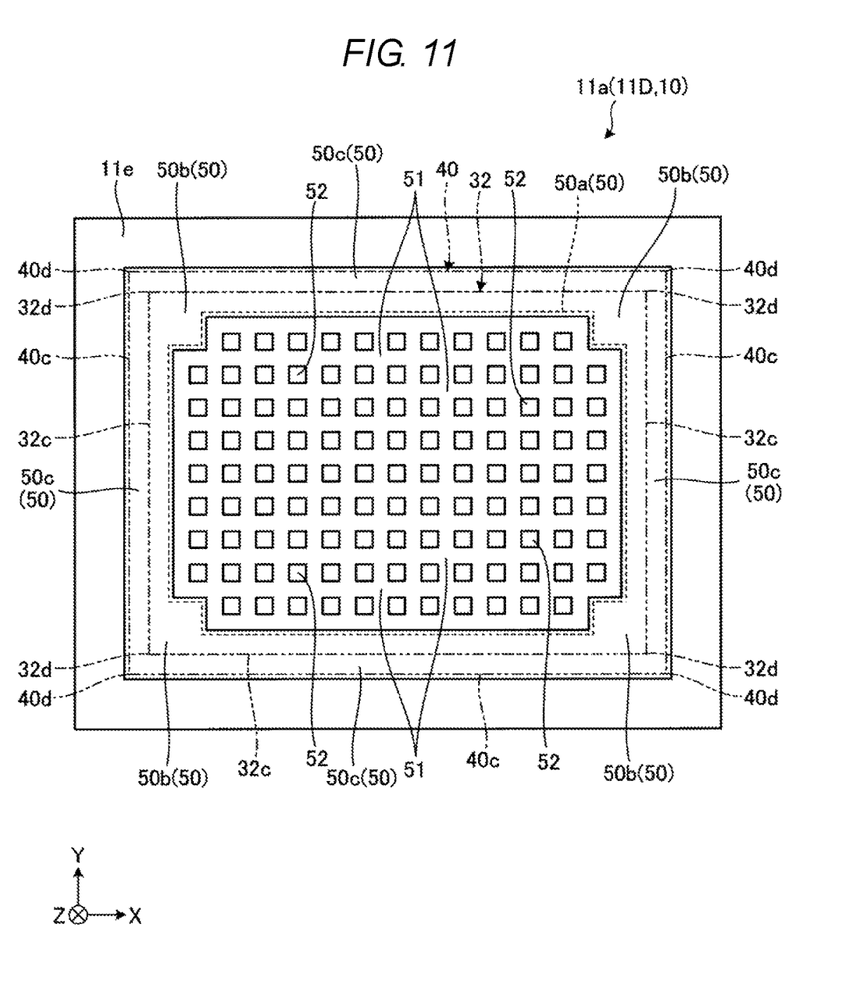
FIG. 11 is a plan view of a part of an inner surface of a wall of a housing provided in a semiconductor memory device according to a second modified example.

FIG. 11 is a partial plan view of an inner surface 11e of a top wall 11a (wall 11D) of a housing 10 according to a second modified example. The top wall 11a of the second modified example can be replaced with the top wall 11a of the semiconductor memory devices 1, 1A, and 1B according to the embodiments described above. In the second modified example, an uneven region 50 includes a recess portion 50c located independently from, and surrounding, a distributed arrangement region 50a. The recess portion 50c is recessed from the surface of the contact portions 51 (the inner surface 11e) in the direction away from the location of the memory 32. The recess portion 50c is provided at a position of the inner surface 11e overlying a side surface 32c (side portion) of the memory 32 in a thickness direction, in other words, at a position opposite to a corner 32d with respect to the heat conduction member 40. Further, the recess portion 50c is provided such that the side surface 32c of the memory 32 is located within the recess portion 50c in the sight line of the thickness direction. According to such a configuration, since the recess portion 50c is provided overlying and extending outwardly of the side surface 32c (side portion) of the memory 32, it is possible to further reduce a force acting on a solder ball 32e provided in the side surface 32c (side portion) of the memory 32 by a compression repulsion force due to the heat conduction member 40. Accordingly, according to the second modified example, the solder ball 32e and the semiconductor memory devices 1, 1A, and 1B are more easily improved in reliability and durability.

Third Modified Example

Figure 12:
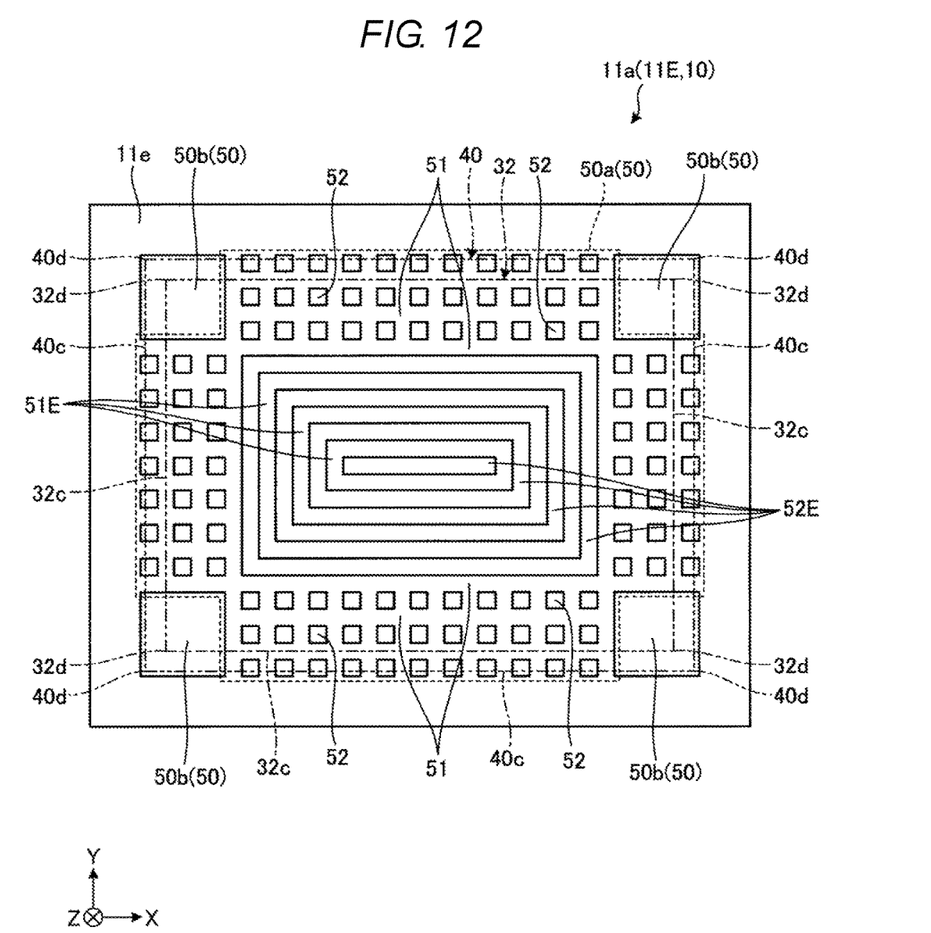
FIG. 12 is a plan view of a part of an inner surface of a wall of a housing provided in a semiconductor memory device according to a third modified example.

FIG. 12 is a partial plan view of an inner surface 11e of a top wall 11a (wall 11E) of a housing 10 according to a third modified example. The top wall 11a of the third modified example can be replaced with the top wall 11a of the semiconductor memory devices 1, 1A, and 1B according to the embodiments described above. In the third modified example, line segment-like linear recess portions 52E are provided at a center of the uneven region 50 with a certain width in a the X and Y directions. The linear recess portions 52E form a plurality of nested rectangular profiles. The uneven region 50 is provided with rectangular and frame-like contact portions 51E surrounding the line segment-like recess portions 52E with a certain width. In addition, the uneven region 50 is provided with rectangular and frame-like recess portions 52E surrounding the rectangular and frame-like contact portions 51E. As described above, the frame-like contact portions 51E and recess portions 52E are alternately provided on the inner surface 11e outwardly from the center of the uneven region 50 in the sight line of the thickness direction, so that one of them surrounds the other. Even with such a configuration, it is possible to obtain the same effect as in the embodiments described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Further, the configurations or shapes of the respective embodiments or modified examples can be partially replaced and implemented. In addition, the specifications (structure, type, direction, shape, size, length, width, thickness, height, number, arrangement, position, and material) of each configuration and shape are changed as appropriate.

For example, the shape of the uneven region in the sight line of the thickness direction may be a circular shape, an oval shape, or polygonal shapes other than the rectangular shape in addition to the rectangular shape. Further, the uneven shape of the uneven region may be a wave shape which smoothly changes. The uneven region may include annular contact portions and recess portions that are alternately arranged in a concentric pattern. In the distributed arrangement region, a plurality of contact portions and a plurality of recess portions may be alternately arranged in a checkerboard pattern, so that the plurality of contact portions and the plurality of recess portions may be dispersedly arranged.

What is claimed is:

1. A semiconductor memory device comprising:
   a housing having a wall;
   a circuit board located in the housing and spaced from the wall, and extending along a surface of the wall;
   a memory located above the circuit board; and
   a heat conduction member interposed between the wall and the memory, the heat conduction member being formed of an elastic material and elastically compressed therebetween, wherein
   the wall includes an uneven region comprising contact portions that contact the heat conduction member and recess portions located between the contact portions, the recess portions recessed inwardly of the wall from ends of the contact portions in a direction away from the memory.

2. The semiconductor memory device according to claim 1, wherein portions of the heat conduction member extend inwardly of the recess portions.

3. The semiconductor memory device of claim 1, wherein portions of the contact portions surround at least one of the recess portions.

4. The semiconductor memory device according to claim 1, wherein
the uneven region includes a region in which at least two of the contact portions and at least two of the recess portions are dispersedly arranged with respect to each other.

5. The semiconductor memory device according to claim 1, wherein
the uneven region includes a region in which the contact portions and the recess portions are provided in a mesh shaped pattern.

6. The semiconductor memory device according to claim 1, wherein
the uneven region includes a region in which a repetitive pattern, having a unit shape including at least one portion of the contact portions and at least one portion of the recess portions, is located.

7. The semiconductor memory device according to claim 1, wherein
the memory comprises a plurality of corners; and
the uneven region further comprises other recess portions facing the corners of the memory, with portions of the heat conduction member extending therebetween.

8. The semiconductor memory device according claim 1, wherein:
the memory comprises a plurality of side walls; and
other recess portions of the uneven region face, and extend outwardly of, a location of the side walls of the memory, with portions of the heat conduction member extending therebetween.

9. The semiconductor memory device according to claim 1, wherein
the wall includes a first surface opposing the circuit board, and a second surface recessed inwardly of the first surface in the direction away from the memory, the contact portion being formed on the second surface;
the heat conduction member extends inwardly of the first surface and contacts the second surface; and
the recess portions extend inwardly of the second surface.

10. A semiconductor device package configured to support one memory device to be located therein or thereon among a plurality of memory devices having a perimeter wall, a first surface, a second surface opposite to the first surface, and a thickness between the first and second surfaces, wherein the thicknesses of different memory devices among the plurality of memory devices are different, comprising:
a housing having a wall;
a circuit board located in the housing and spaced from the wall, and extending along a surface of the wall; and
a heat conduction member formed of an elastic material, wherein
the wall includes an uneven region comprising contact portions contacting the heat conduction member and recess portions located between the contact portions, the recess portions recessed inwardly of the wall from ends of the contact portions in a direction away from a mounting location of said one memory device, and
the heat conduction member is positioned to be elastically compressed between said one memory device and the wall when said one memory device is mounted in the semiconductor device package.

11. The semiconductor memory device package according to claim 10, wherein portions of the heat conduction member extend inwardly of the recess portions.

12. The semiconductor memory device package according to claim 10, wherein portions of the contact portions surround at least one of the recess portions.

13. The semiconductor memory device package according to claim 10, wherein
the uneven region includes a region in which at least two of the contact portions and at least two of the recess portions are dispersedly arranged with respect to each other.

14. The semiconductor memory device package according to claim 10, wherein
the uneven region includes a region in which the contact portions and the recess portions are provided in a mesh shaped pattern.

15. The semiconductor memory device package according to claim 10, wherein
the uneven region includes a region in which a repetitive pattern, having a unit shape including at least one portion of the contact portions and at least one portion of the recess portions, is located.

16. The semiconductor memory device package according to claim 10, wherein
each of the plurality of memory devices comprises a plurality of corners;
the uneven region further comprises other recess portions facing a mounting location of the corners of said one memory device; and
the heat conduction member extends over the recess portions facing the mounting location of the corners of said one memory device.

17. The semiconductor memory device package according claim 10, wherein
each of the plurality of memory devices comprises a plurality of side walls;
other recess portions of the uneven region face, and extend outwardly of, a mounting location of a perimeter of said one memory device; and
the heat conduction member extends over the mounting location of the perimeter of said one memory device.

18. The semiconductor memory device package according to claim 10, wherein:
the wall includes a first wall surface opposing the circuit board and a second wall surface, recessed inwardly of the first wall surface in the direction away from a mounting location of said one memory device, the contact portion being formed on the second wall surface;
the heat conduction member extends inwardly of the first wall surface and contacts the wall second surface; and
the recess portions extend inwardly of the second wall surface.

19. A semiconductor memory device, comprising:
a housing having a first wall, the first wall including a plurality of recesses extending inwardly thereof;
a compressible heat transfer member comprising a first surface and a second surface opposite to the first surface, the first surface thereof contacting the first wall, the compressible heat transfer member being formed of an elastic material, elastically compressed, and having a first thickness between the first and second surfaces thereof less than a thickness of the compressible heat transfer member in a non-compressed state;
a memory having a third surface and a fourth surface opposite to the third surface, and a second thickness between the third and fourth surfaces, the third surface contacting the second surface of the compressible heat transfer member; and a circuit board facing the fourth surface of the memory and spaced from the first wall by a gap distance, wherein the sum of the first thickness of the heat transfer member and the second thickness of the memory is equal to the gap distance.

20. The semiconductor memory device of claim 19, wherein a portion of the compressible heat transfer member extends into at least one of the plurality of recesses.

* * * * *